(12) United States Patent
Tan et al.

(10) Patent No.: US 10,453,761 B2
(45) Date of Patent: Oct. 22, 2019

(54) EXTERNAL GETTERING METHOD AND DEVICE

(71) Applicant: Micron Technology, Inc., Boise, ID (US)

(72) Inventors: Michael Tan, Singapore (SG); Cheng P. Pour, Singapore (SG)

(73) Assignee: Micron Technology, Inc., Boise, ID (US)

( * ) Notice: Subject to any disclaimer, the term of this patent is extended or adjusted under 35 U.S.C. 154(b) by 290 days.

(21) Appl. No.: 15/395,169

(22) Filed: Dec. 30, 2016

(65) Prior Publication Data

US 2017/0110381 A1 Apr. 20, 2017

Related U.S. Application Data

(62) Division of application No. 14/931,806, filed on Nov. 3, 2015, now Pat. No. 9,543,166, which is a division of application No. 13/024,806, filed on Feb. 10, 2011, now Pat. No. 9,177,828.

(51) Int. Cl.
| | | |
|---|---|---|
| *H01L 23/26* | (2006.01) | |
| *H01L 21/322* | (2006.01) | |
| *H01L 23/31* | (2006.01) | |
| *H01L 21/56* | (2006.01) | |
| *H01L 23/00* | (2006.01) | |
| *H01L 27/146* | (2006.01) | |
| *H01L 31/18* | (2006.01) | |
| *H01L 51/52* | (2006.01) | |

(52) U.S. Cl.
CPC .......... *H01L 23/26* (2013.01); *H01L 21/3221* (2013.01); *H01L 21/3225* (2013.01); *H01L 21/565* (2013.01); *H01L 23/3128* (2013.01); *H01L 23/564* (2013.01); *H01L 27/14698* (2013.01); *H01L 31/186* (2013.01); *H01L 51/5259* (2013.01); *H01L 2224/16225* (2013.01); *H01L 2924/15311* (2013.01); *Y10T 428/28* (2015.01)

(58) Field of Classification Search
None
See application file for complete search history.

(56) References Cited

U.S. PATENT DOCUMENTS

| | | | |
|---|---|---|---|
| 5,753,560 A | 5/1998 | Hong | |
| 6,165,872 A | 12/2000 | Kageyama | |
| 6,323,550 B1 | 11/2001 | Martin | |
| 6,548,382 B1 | 4/2003 | Henley | |
| 6,639,327 B2 | 10/2003 | Momoi | |
| 6,696,352 B1 | 2/2004 | Carr | |
| 7,374,818 B2 | 5/2008 | Bhatia | |

(Continued)

FOREIGN PATENT DOCUMENTS

FR    2967150 A1    5/2012

*Primary Examiner* — Shaun M Campbell
(74) *Attorney, Agent, or Firm* — Perkins Coie LLP (57) ABSTRACT

Disclosed embodiments include external gettering provided by electronic packaging. An external gettering element for a semiconductor substrate, which may be incorporated as part of an electronic packaging for the structure, is disclosed. Semiconductor structures and stacked semiconductor structures including an external gettering element are also disclosed. An encapsulation mold compound providing external gettering is also disclosed. Methods of fabricating such devices are also disclosed.

7 Claims, 11 Drawing Sheets

(56) References Cited

U.S. PATENT DOCUMENTS

| | | |
|---|---|---|
| 2002/0181866 A1 | 12/2002 | Crook |
| 2005/0239267 A1 | 10/2005 | Tobashi |
| 2005/0285232 A1 | 12/2005 | Jiang |
| 2005/0285256 A1* | 12/2005 | Jiang ............... H01L 21/3221 257/701 |
| 2006/0100299 A1 | 5/2006 | Malik et al. |
| 2006/0134825 A1 | 6/2006 | Dcamp |
| 2007/0187618 A1 | 8/2007 | Dolan |
| 2008/0197454 A1 | 8/2008 | Rakotoniana |
| 2008/0224269 A1* | 9/2008 | Park ................ H01L 21/3221 257/617 |
| 2010/0148661 A1 | 6/2010 | Farquhar et al. |
| 2011/0025196 A1 | 2/2011 | Rakuff |
| 2011/0068480 A1* | 3/2011 | Hayashi ............... C08L 63/00 257/777 |
| 2011/0151173 A1 | 6/2011 | Ramadas et al. |
| 2012/0024722 A1 | 2/2012 | Chen |
| 2012/0056333 A1* | 3/2012 | Sasaki ................ H01L 25/16 257/777 |
| 2012/0125431 A1 | 5/2012 | Oizumi |

* cited by examiner

FIG. 1

PRIOR ART

FIG. 2  PRIOR ART

PRIOR ART

EXTERNAL GETTERING METHOD AND DEVICE

CROSS-REFERENCE TO RELATED APPLICATIONS

This application is a divisional of U.S. application Ser. No. 14/931,806, filed Nov. 3, 2015, which is a divisional of U.S. application Ser. No. 13/024,806, filed Feb. 10, 2011, now U.S. Pat. No. 8,177,828, each of which is incorporated herein by reference in its entirety.

TECHNICAL FIELD

The disclosure relates generally to semiconductors, and more particularly, to semiconductor structures and corresponding methods of fabrication.

BACKGROUND

Semiconductor devices are typically fabricated upon a wafer, which may be a silicon (Si)-based wafer, or other suitable materials known in the art. One process conventionally applied to Si wafers of semiconductor devices is known as a "stress relief" process. Stress relief processes are typically applied after the bulk substrate used to form the wafer has been thinned, for example, through a backside grinding process. At least in part due to the thinning process, areas of stress may be formed at the backside of the wafer.

In the stress relief process, the thinned backside of the wafer is polished, thereby shifting some of the stress at the backside of the wafer away from the stress-relieved backside of the wafer and distributing it more evenly throughout the wafer. Examples of stress relief processes include dry polish (DP) techniques, such as mechano-chemical polishing (MCP) techniques, and chemical-mechanical polishing/planarization (CMP) techniques, as well as other techniques known in the art. The stress relief process increases the overall strength of the wafer, thereby increasing die strength, particularly for ultra thin dies (i.e., dies in the sub-50 gm range).

During fabrication of a semiconductor wafer, unwanted contaminants and impurities can be introduced to the wafer during crystal growth or subsequent wafer fabrication processes. Such contaminants and impurities can degrade characteristics and overall yield of devices formed in the semiconductor wafer. Gettering processes can be performed during crystal growth or wafer fabrication steps to move contaminants and/or impurities in a semiconductor wafer into its bulk and away from a device region. Gettering creates a zone in the bulk substrate, known as a denude zone, that is substantially clear of contaminants. Preferably, semiconductor devices (for example, source and drain structures, gate structures, and channel sections) are built in, on, or around the denude zone of the substrate.

Two types of gettering processes are employed in conventional semiconductor wafer fabrication. "Intrinsic gettering" refers to the formation of gettering sites within the bulk substrate. One process for providing intrinsic gettering includes the formation of silicon dioxide ($SiO_2$) sites within the silicon bulk. These SiO2 sites attract and trap ionic impurities within the silicon wafer, thus preventing these impurities from contaminating the device region. "Extrinsic gettering" refers to the use of an external process, such as backside grinding, to create damage or stress ("defects") in silicon lattices in the wafer. Extrinsic gettering is typically applied at a backside of the wafer. The defects that are created at the backside of the wafer attract impurities, pulling them away from the device section, which is located at a different side (typically, a topside) of the wafer.

As discussed above, performing stress relief processes, such as DP, MCP, or CMP techniques, strengthens the wafer, thereby increasing die strength. It has been observed, however, that the electrical performances of semiconductor devices, and particularly of semiconductor devices in ultrathin, multi-stack memory devices, may degrade after stress relief processes are applied. This degradation of electrical performance may be attributable to an increase in one or more of contamination-induced leakage, stress-induced leakage, dislocation-induced leakage. Contamination-induced leakage results from metal contaminants and/or free ions in the substrate creating a short circuit at the gates of the memory devices. Stress-induced leakage results from the "stress zone," which would typically attract contaminants and free ions, being shifted from the wafer backside towards the area where the semiconductor devices are formed. Dislocation-induced leakage results from Crystal Originated Pits/Particles ("COPs"), slips, and dislocations within the silicon creating a short circuit.

Applicants have observed that the increase of contamination-induced leakage, stress-induced leakage, and dislocation-induced leakage may be a result of conventional wafer-thinning and stress relief techniques. These conventional techniques reduce and/or eliminate the intrinsic and extrinsic gettering sites of the wafer.

Figure 1:
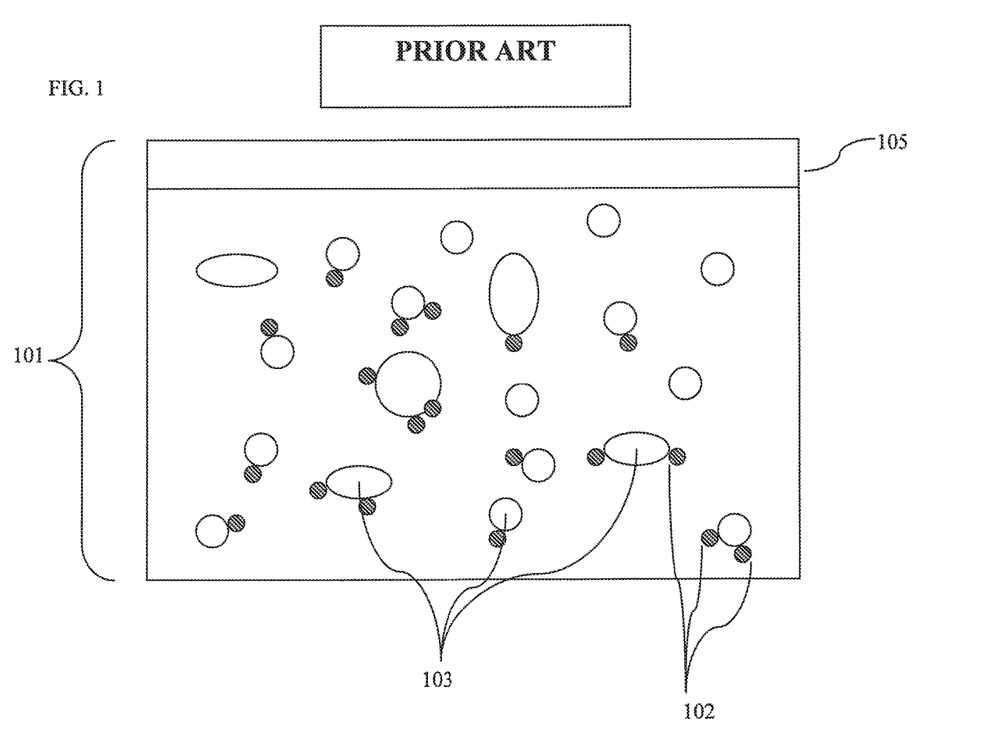
FIG. 1 is a cross-sectional view of a semiconductor device with conventional intrinsic gettering.

By way of further explanation, FIG. 1 illustrates a conventional intrinsic gettering technique. In FIG. 1, bulk substrate 101 includes crystal defects 103, such as oxidation-induced stacking faults (OSF), or bulk micro defects (BMD), within substrate 101. Crystal defects 103 provide intrinsic gettering to the substrate 101. As shown in FIG. 1, metal contaminants 102 are attracted to the crystal defects 103, providing a denude zone 105 at a front side of the substrate 101.

Figure 2:
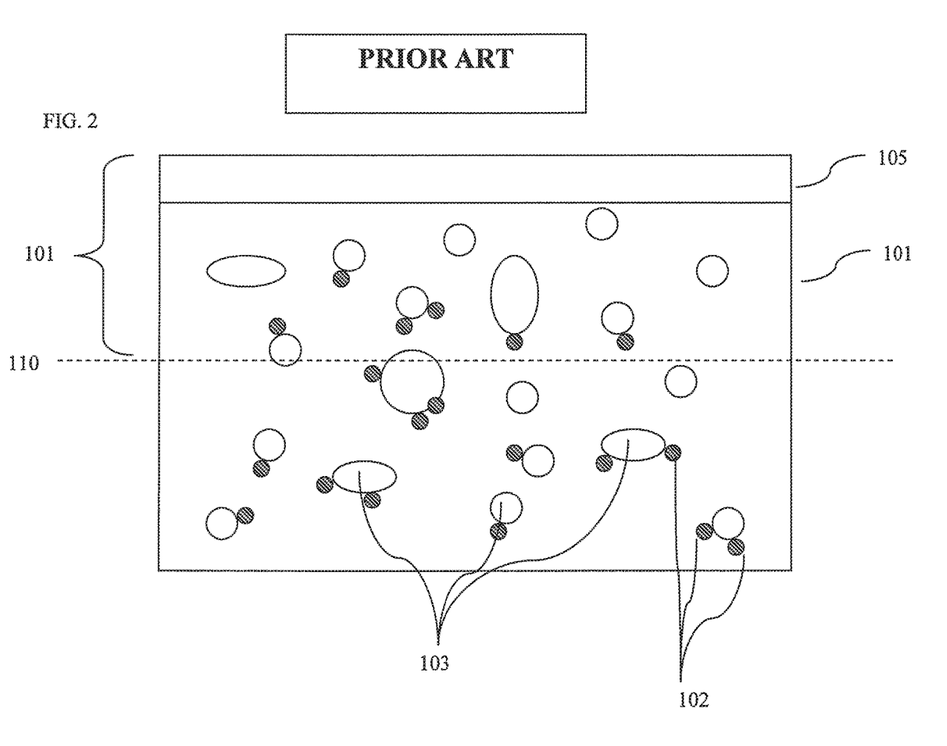
FIG. 2 is a cross-sectional view of a semiconductor device with conventional intrinsic gettering subject to grinding and/or thinning processes.

As illustrated in FIG. 2, however, the bulk substrate 101 is then reduced in thickness through grinding and/or other conventional wafer thinning processes. When substrate 101 is thinned and/or grinded to a desired thickness 110 (as shown in FIG. 2), the volume of the backside of bulk substrate 101, and thus number of crystal defects 103 outside of the denude zone, is reduced, thereby reducing the amount of intrinsic gettering.

Figure 3A:
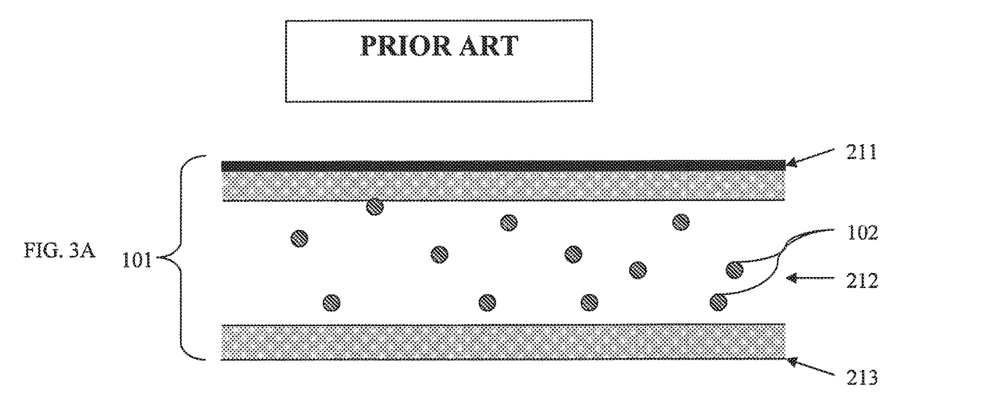
FIGS. 3A-3B are cross-sectional views of a semiconductor device with conventional extrinsic gettering.
Figure 3B:
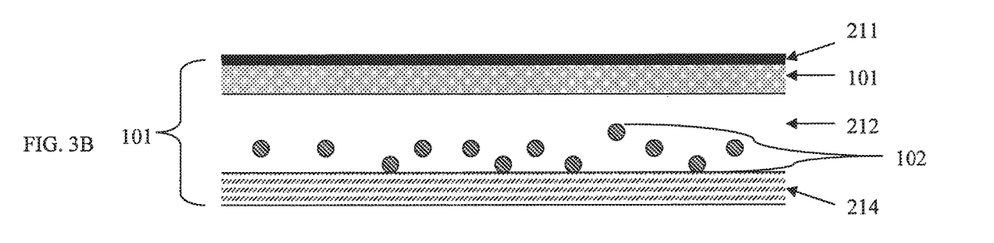

FIGS. 3A-3B illustrate a conventional extrinsic gettering technique. As shown in FIG. 3A, a device section 211 may be formed in a denude zone within bulk substrate 101. Substrate 101 includes an intrinsic gettering section 212 with contaminants 102. Intrinsic gettering section 212 may or may not include intrinsic gettering, as described above with regard to FIG. 1. In FIG. 3A, substrate 101 includes an unpolished backside oxidized layer 213. As shown in FIG. 3B, when bulk substrate 101 is reduced through conventional thinning processes, the thickness of intrinsic gettering section 212 is reduced (as discussed above with regard to FIG. 2). Despite this reduction of intrinsic gettering section 212, as shown in FIG. 3B, extrinsic gettering is provided by the backside grind layer 214 formed by the thinning process. Backside grind layer 214 includes defects in silicon lattices that are formed as a result of the thinning of the backside of substrate 101. These defects attract and/or trap impurities, pulling them away from the denude zone 211.

Figure 4:
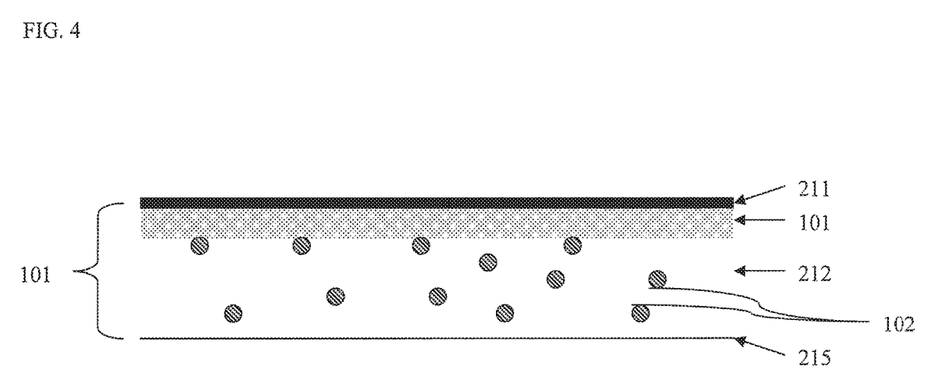
FIG. 4 is a cross-sectional view of a semiconductor device with conventional extrinsic gettering subject to stress relief processes.

As illustrated in FIG. 4, however, when conventional stress relief processes (such as DP, MCP, and/or CMP) are applied to remove backside grind layer 214 (FIG. 3B) and form a stress-relieved backside 215, many of the defects that were present in backside grind layer 214 and that acted as extrinsic gettering sites are also removed. As stress relief processes shift the stress previously caused by defects in the backside grind layer 214 away from the stress-relieved backside 215 towards the denude zone 211, mobile metals or ions are able to travel freely towards the device area, potentially short circuiting components of devices formed therein or otherwise undesirably affecting the devices' performances.

Experiments have shown that, by maintaining the extrinsic gettering provided by the backside grind layer after the wafer thinning process, device performances are not degraded. Grind wheels with super fine finishing (for example, with extra small diamond grits size) that leave some portion of the backside grind layer in place are known in the art, and may be used in place of conventional polishing processes. Examples of such "fine" polishing techniques may use, for example, Gettering Dry Polish ("GDP") and Poligrind® grinding wheels from Disco Corp., or other appropriate systems and processes that are known in the art. Experiments have also shown, however, that such fine polishing techniques, while preserving extrinsic gettering, may reduce die strength compared to other techniques that do not maintain extrinsic gettering (such as, for example, DP, MCP, and CMP polish processes). This reduced die strength can be detrimental to the assembly process for semiconductor devices, particularly for sub-50 µm multiple stack die packages.

Accordingly, it is desirable to maintain gettering in fabricated semiconductor wafers and dies formed therefrom. Also desirable is a fabrication process for semiconductor wafers and dies that includes the strengthening benefits of selected stress relief techniques, while maintaining the performance benefits of gettering for the semiconductor wafer.

DETAILED DESCRIPTION

In the following detailed description, reference is made to various embodiments of the invention. These embodiments are described with sufficient detail to enable those skilled in the art to practice them. It is to be understood that other embodiments may be employed, and that various structural, logical and electrical changes may be made. In addition, reference is made to various processes including multiple steps. It should be understood that these steps need not be performed in the order that they are listed, unless specifically stated as such.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. The substrate, as well as devices formed therein, may be formed of any appropriate materials known in the art. When reference is made to a semiconductor substrate or wafer in the following description, previous process steps may have been utilized to form regions or junctions in or over the base semiconductor or foundation.

In embodiments described below, external gettering is applied to semiconductor devices using electronic packaging. For example, in certain embodiments an external gettering element is applied to a backside of a semiconductor substrate. The external gettering element may be integrated with or arranged by electronic packaging that is typically used when fabricating a semiconductor device using the semiconductor substrate. For example, the external gettering element may be integrated with, or adhered by, an adhesive material that is applied to an already-polished backside of a substrate. In other embodiments described below, an encapsulation mold compound embedded with one or more additives may be formed around the semiconductor substrate.

Figure 5:
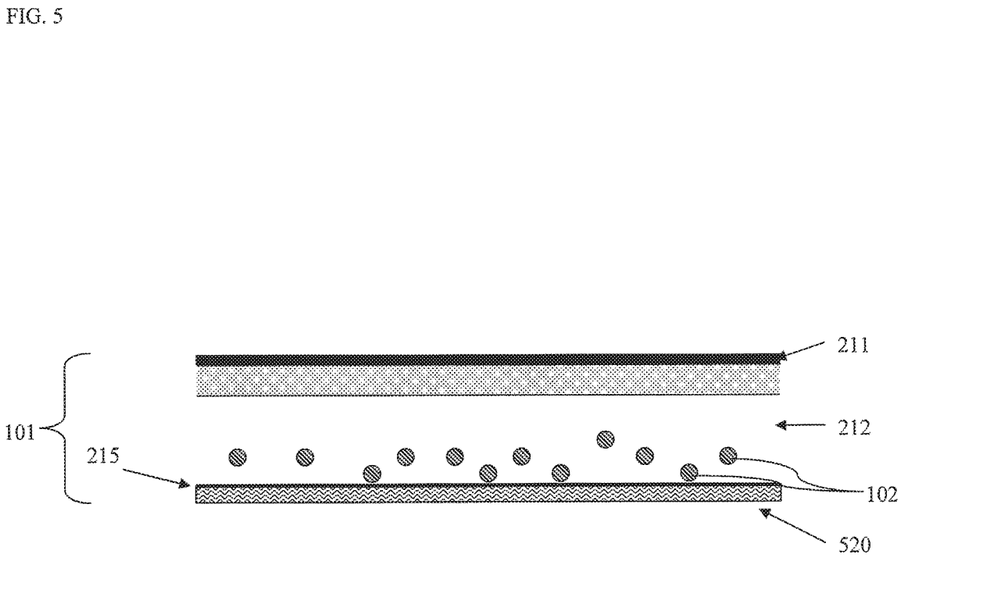
FIG. 5 is a cross-sectional view of a semiconductor device including an external gettering element according to a first embodiment described herein.

FIG. 5 is a cross-sectional view of a semiconductor device including external gettering according to a first embodiment. FIG. 5 illustrates a bulk substrate 101, including a device section 211 and an internal gettering section 212. As shown in FIG. 5, bulk substrate 101 includes contaminants 102. It should be understood that, while an internal gettering section 212 is shown, embodiments need not include any internal gettering within substrate 101.

Bulk substrate 101 in FIG. 5 has already been subjected to a thinning process, such as a backside grinding process, and stress relief processes, such as DP, MCP, or CMP processes described above, in order to achieve a desired thickness and to maintain the die strength of substrate 101. Accordingly, bulk substrate 101 includes a stress relieved backside 215, as described above with regard to FIG. 4.

As shown in FIG. 5, an external gettering element 520 is applied to stress relieved backside 215. In the embodiment shown in FIG. 5, external gettering element 520 includes a gettering material that is integrated into an adhesive material. The adhesive material may be a type of adhesive material typically employed as part of the electrical packaging used during fabrication of semiconductor devices. For example, external gettering element 520 may be integrated into a die attach film ("DAF"), which is then applied to stress relieved backside 215. Examples of DAF products known in the industry that may be appropriate for integration with a gettering material include Nitto Denko's EM-550H-P, Lintec Corp.'s LE4424, and Henkel Corp.'s ATB-130, to name but a few.

The gettering material of external gettering element 520 may be, for example, a substrate or other polymeric, ceramic, silicon, or epoxy-based material, or any material compliant with electronic packaging, which has been imbued with ions of different polarities or quantity. The ions used to imbue the gettering material of external gettering element 520 may be organic and/or inorganic additives, for example, oxide ions, silicon ions, carbide ions, or other types of ions that can be used to imbue gettering materials. The polarity and quantity of ions that may be imbued in the gettering material of external gettering element 520 may be highly situational and/or device dependent, and accordingly it should be understood that any appropriately ion-imbued material may be used. For example, gettering materials for varying purposes may have one of multiple different concentration levels, such as a high, medium, or low concentration level.

In a preferred embodiment, a gettering material may be soaked in an organic ion solution, such as a Copper (Cu) ion solution, until a high concentration level is reached. The ion concentration level of the material may then be measured by conventional methods, such as by using the ICP-AES method that is commonly known in the art.

When the gettering material is integrated into a DAF, as shown in the external gettering element 520, the external gettering element 520 may be adhered directly to stress relieved backside layer 215. External gettering element 520 provides external gettering, attracting and/or trapping mobile metals or ions contaminants 102 in the substrate 101 towards the backside 215 of substrate 101 and away from device section 211. Accordingly, external gettering element 520 provides for the performance benefits of gettering, while maintaining the strengthening benefits of stress relief techniques.

Figure 6A:
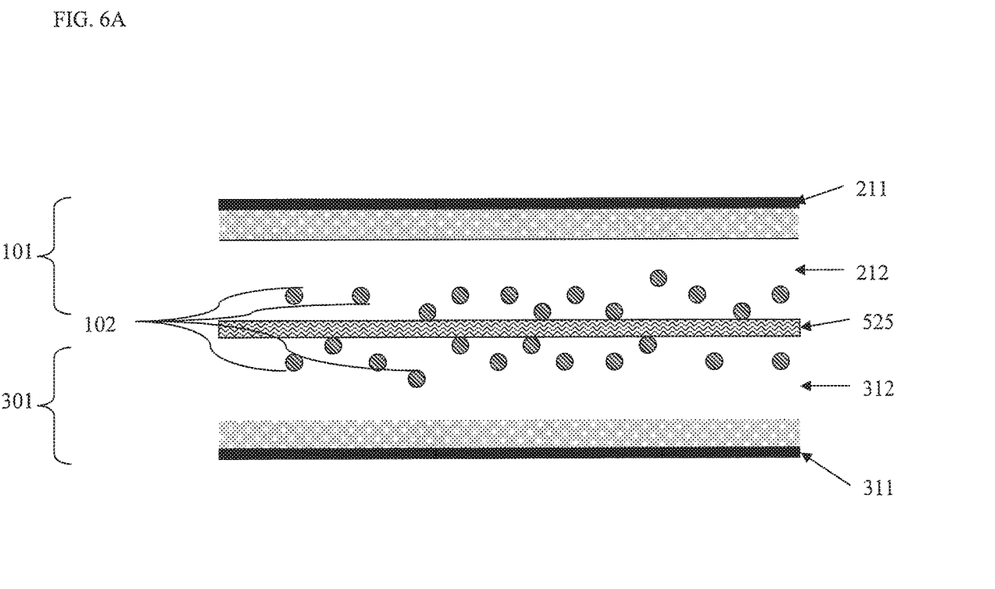
FIG. 6A is a cross-sectional view of a semiconductor device including an external gettering element according to a second embodiment described herein.
Figure 6B:
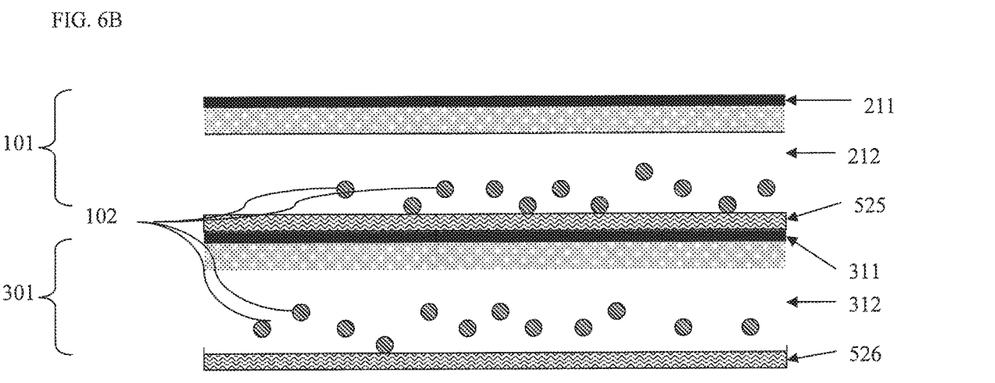
FIG. 6B is a cross-sectional view of a semiconductor device including an external gettering element according to a third embodiment described herein.

Stacked semiconductor packages, such as wafer-on-wafer packages and other forms of three-dimensional semiconductor packaging, can provide increased spatial efficiency for devices utilizing semiconductor technology. FIGS. 6A and 6B show two such examples of a stacked package including the external gettering concept described above.

FIG. 6A is a cross-sectional view of a semiconductor device including external gettering according to a second embodiment. FIG. 6A shows one such example of a stacked package, including a first wafer with a first semiconductor substrate 101, device layer 211, and intrinsic gettering layer 212, and a second wafer with a second semiconductor substrate 301, device layer 311, and intrinsic gettering layer 312. It should be understood that, while internal gettering sections 212, 312 are shown in substrates 101, 301, embodiments need not include any internal gettering.

The respective backsides of substrates 101 and 301 are adhered by an external gettering element 525 that is integrated into a dual-sided adhesive, such as a dual-sided DAF product known in the industry, including, for example, Nitto Denko's EM 55011-P. As shown in FIG. 6, external gettering element 525 provides external gettering to both substrates 101, 301, pulling contaminants 102 towards the respective backsides and away from the respective device sections 211, 311.

FIG. 6B is a cross-sectional view of a semiconductor device including external gettering according to a third embodiment. FIG. 6B shows another such example of a stacked package, including similar elements to those described above with regard to FIG. 6A. In FIG. 6B, however, device layer 311 of substrate 301 is adhered to the backside of substrate 101 by the external gettering element 525 that is integrated into a dual-sided adhesive. Device layer 311 of substrate 301 may be provided extrinsic gettering by a separate external gettering element 526, which may be, for example, a single or dual-sided adhesive with an integrated gettering material. Alternatively, the external gettering element at the backside of substrate 301 may be a separate external gettering element adhered by an adhesive material.

Figure 7:
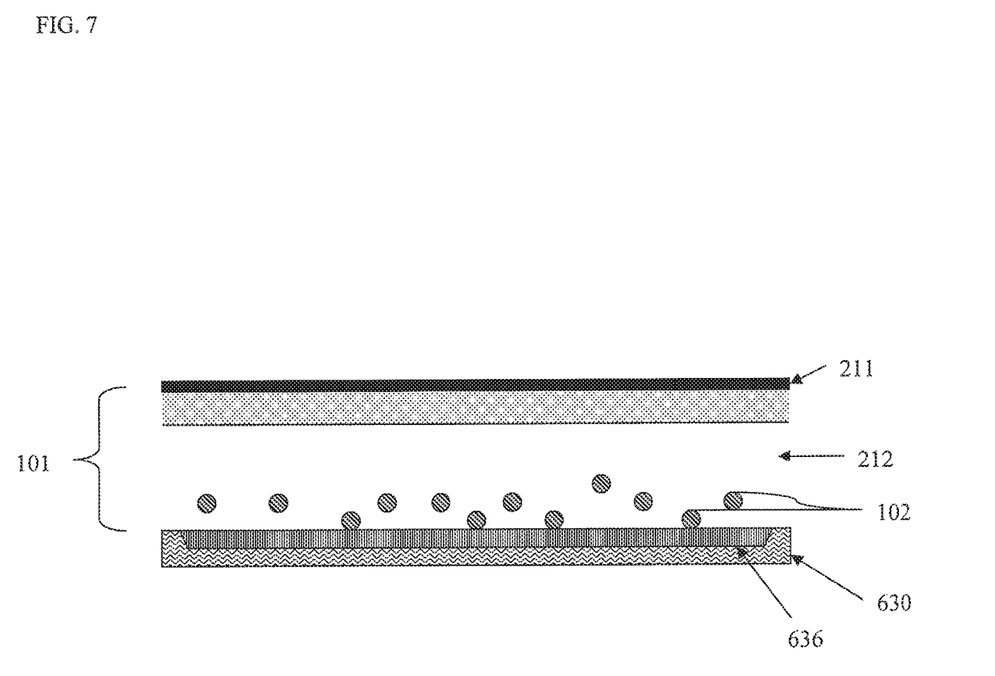
FIG. 7 is a cross-sectional view of a semiconductor device including an external gettering element according to a fourth embodiment described herein.

FIG. 7 is a cross-sectional view of a semiconductor device including external gettering according to a fourth embodiment. In FIG. 7, the external gettering element includes a stand-alone layer of gettering material 636, separate from an adhesive material 630, which is applied on the stress-relieved backside of substrate 101. Gettering material 636 may be, for example, a substrate or other polymeric, ceramic, silicon, or epoxy-based material, or any material compliant with electronic packaging, which has been imbued with ions of different polarities or quantity. Adhesive material 630, which may be, for example, a conventional DAF or another known adhesive or laminate, holds the gettering material in place on the backside of substrate 101.

Figure 8A:
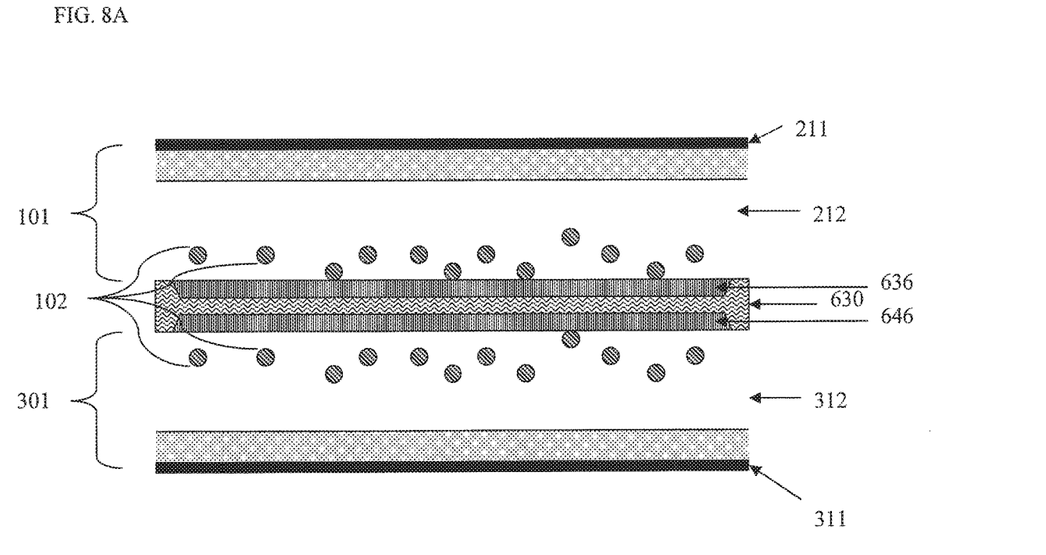
FIG. 8A is a cross-sectional view of a semiconductor device including an external gettering element according to a fifth embodiment described herein.

The concept described above with regard to FIG. 7 may also be applied to form a stacked package. FIG. 8A is a cross-sectional view of a semiconductor device including external gettering according to a fifth embodiment. FIG. 8A shows one such example of a stacked package, including a first wafer with a first bulk substrate 101, device layer 211, and intrinsic gettering layer 212, and a second bulk substrate 301, device layer 311, and intrinsic gettering layer 312. The respective backsides of substrates 101 and 301 are adhered by a dual-sided adhesive 630, such as a dual-sided DAF product known in the industry. Dual-sided adhesive 630 also laminates external gettering elements 636, 646 to the stress-relieved backside of substrate 101. External gettering elements 636, 646 are stand-alone layers of gettering material that are not integrated into the adhesive 630, similar to the gettering material described above with regard to FIG. 7. External gettering elements 636, 646 have been imbued with ions of different polarities or quantity, in order to provide appropriate external gettering to the respective substrates 101, 301 by pulling contaminants 102 towards the respective backsides and away from the respective device sections 211, 311. It should be understood that, while multiple external gettering elements 636, 646 are shown in FIG. 8, in other embodiments, a single external gettering element may be adhered to a backside of one of substrates 101 and 301.

Figure 8B:
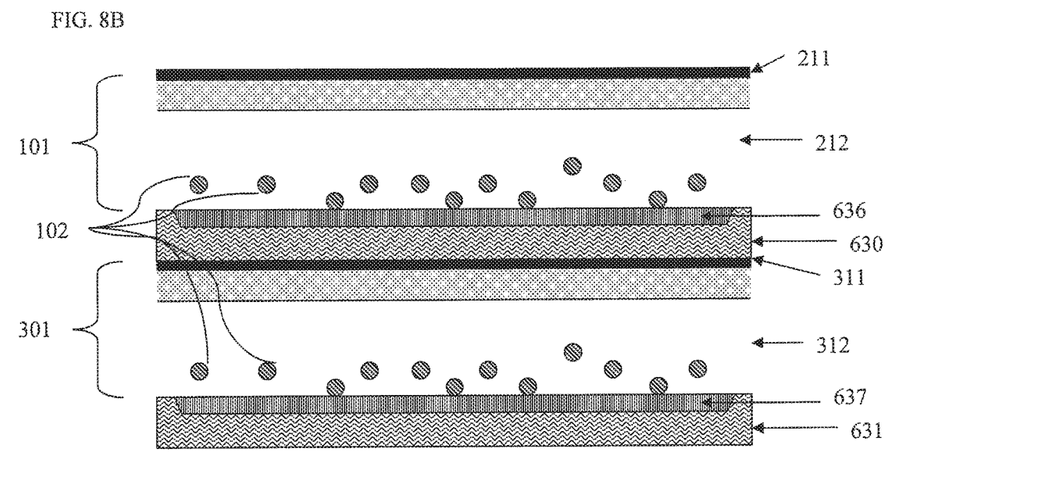
FIG. 8B is a cross-sectional view of a semiconductor device including an external gettering element according to a sixth embodiment described herein.

FIG. 8B is a cross-sectional view of a semiconductor device including external gettering according to a sixth embodiment. FIG. 8B shows another such example of a stacked package, including similar elements to those described above with regard to FIG. 8A. In FIG. 8B, however, device layer 311 of substrate 301 is adhered to the backside of substrate 101 by the adhesive 630, and external gettering element 646 is omitted. Device layer 311 of substrate 301 may be provided extrinsic gettering by a separate external gettering element 637, which may be, for example, adhered to the backside of substrate 301 by a separate adhesive 631. Alternatively, the external gettering element at the backside of substrate 301 may be integrated into an adhesive.

Figure 9:
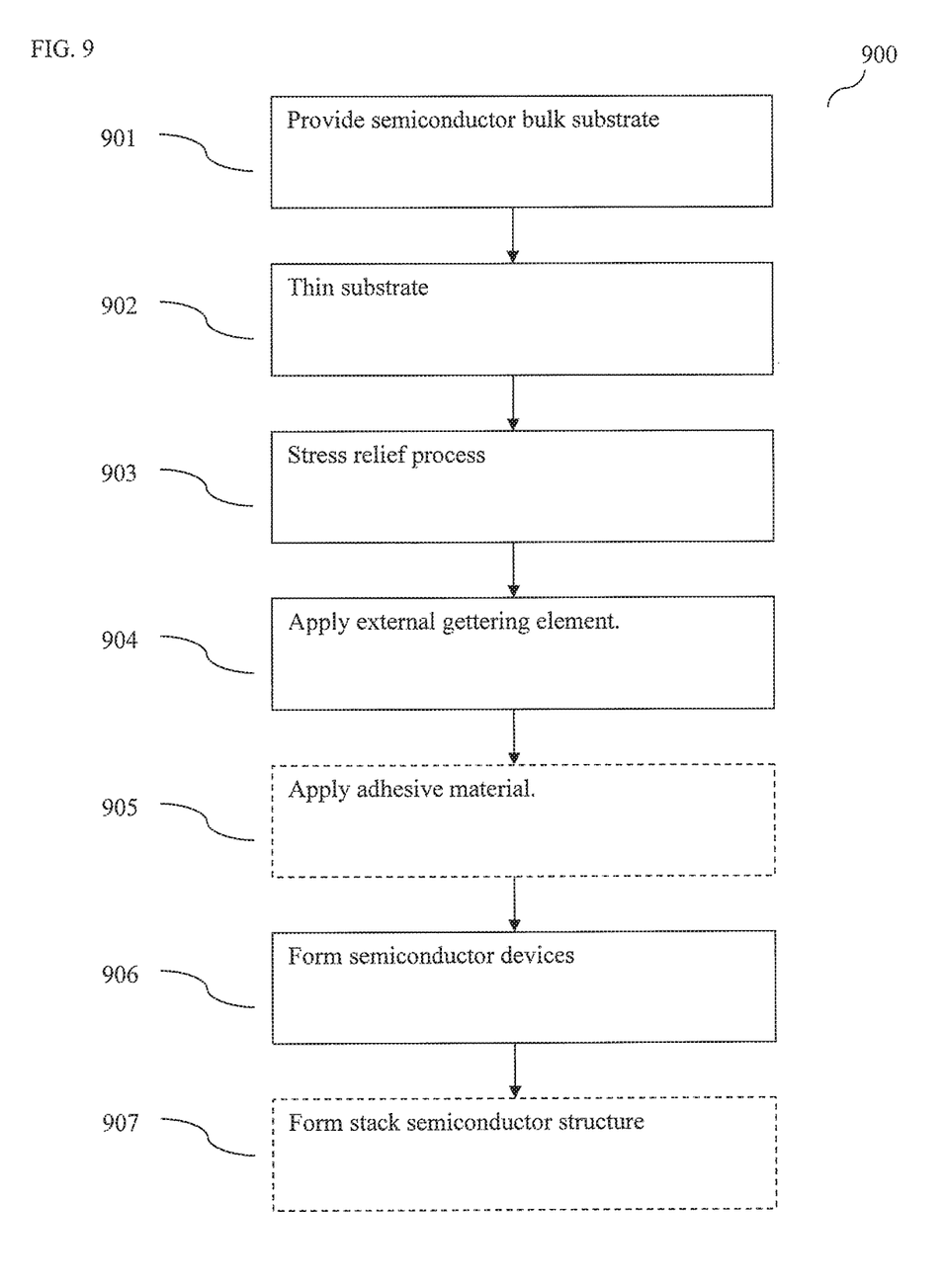
FIG. 9 is a flowchart illustrating steps of a fabrication process for a semiconductor device including an external gettering element.

FIG. 9 is a flowchart illustrating steps of a fabrication process 900 for a semiconductor device including an external gettering element. Process 900 may be used to fabricate one or more of the embodiments described above with regard to FIGS. 5-8.

In step 901, a bulk semiconductor substrate is provided. The bulk semiconductor substrate may be, for example, a silicon substrate or other material, and may include an internal gettering section, as discussed above with regard to bulk substrate 101 (FIG. 5).

In step 902, the bulk substrate is thinned. For example, the backside of the bulk substrate may be subjected to a backside grinding process, as described above, or to any appropriate thinning process known in the art.

In step 903, the substrate is subjected to a stress relief process to polish the backside of the wafer and increase overall wafer strength. For example, dry polish (DP) techniques, such as mechano-chemical polishing (MCP) techniques, or chemical-mechanical polishing/planarization (CMP) techniques may be used. Alternatively, other techniques such as GDP, Poligrind®, or other known polishing techniques may be used.

In step 904, an external gettering element is applied to the stress-relieved backside of the substrate. The external gettering element may comprise a gettering material, such as a substrate or other polymeric, ceramic, silicon, or epoxy-based material, or any appropriately ion-imbued material. The ions used to imbue the gettering material of external gettering element may be, for example, organic or inorganic additives, such as oxide ions, silicon ions, carbide ions, or other types of ions that can be used to imbue gettering materials. The gettering material may be imbued with organic or inorganic ions through known processes, such as by soaking the gettering material in an ion solution.

The external gettering element may be integrated into an adhesive material, as described above with regard to FIGS. 5-6. Alternatively, the external gettering element may be a stand-alone layer of gettering material, as described above with regard to FIGS. 7-8. If a stand-alone layer is used as the external gettering element, in step 905, an adhesive or laminate, such as a conventional single-sided or dual-sided DAF, may be applied to maintain the external gettering element on the backside of the substrate, and/or to provide adhesive for a multiple-die stacked semiconductor structure (see Step 907, supra) such as the stacked structure shown in FIG. 8. It should be understood that, if the gettering material is integrated into an adhesive material in step 904, then step 905 may optionally be omitted.

In step 906, semiconductor devices are formed in the denude zone that is provided by the external gettering of the external gettering element. Formed semiconductor devices may include, for example, source and drain structures, gate structures, channel sections, and other structures known in the art. It should be understood that, if a stack semiconductor structure is formed (see Step 907, supra), then semiconductor devices may instead be formed in one or both substrates after the formation of the stack semiconductor structure.

In step 907, a stack semiconductor structure can be formed, using the semiconductor substrate with applied external gettering element formed in steps 901-906. In one embodiment, the external gettering element is integrated into a dual-sided DAF, as described above with regard to FIG. 6. The dual-sided DAF may be used to attach a second semiconductor wafer. The second semiconductor wafer may receive the benefit of external gettering from the same external gettering element as the first wafer, and/or from a separate external gettering element. In another embodiment, a conventional dual-sided DAF may be used to attach the second semiconductor wafer, and may also be used to adhere a second external gettering element to the backside of the second semiconductor wafer, as described above with regard to FIG. 8.

It should be understood that, while FIGS. 5 through 9 describe embodiments where an adhesive material is used with an external gettering element, the concept described herein is not so limited. For example, some configurations of semiconductor devices may not require adhesives, such as DAF, in their manufacture, and adding an adhesive to the manufacturing process may be undesirable. In addition, it may be desirable to provide gettering to semiconductor devices using more than one technique.

Figure 10:
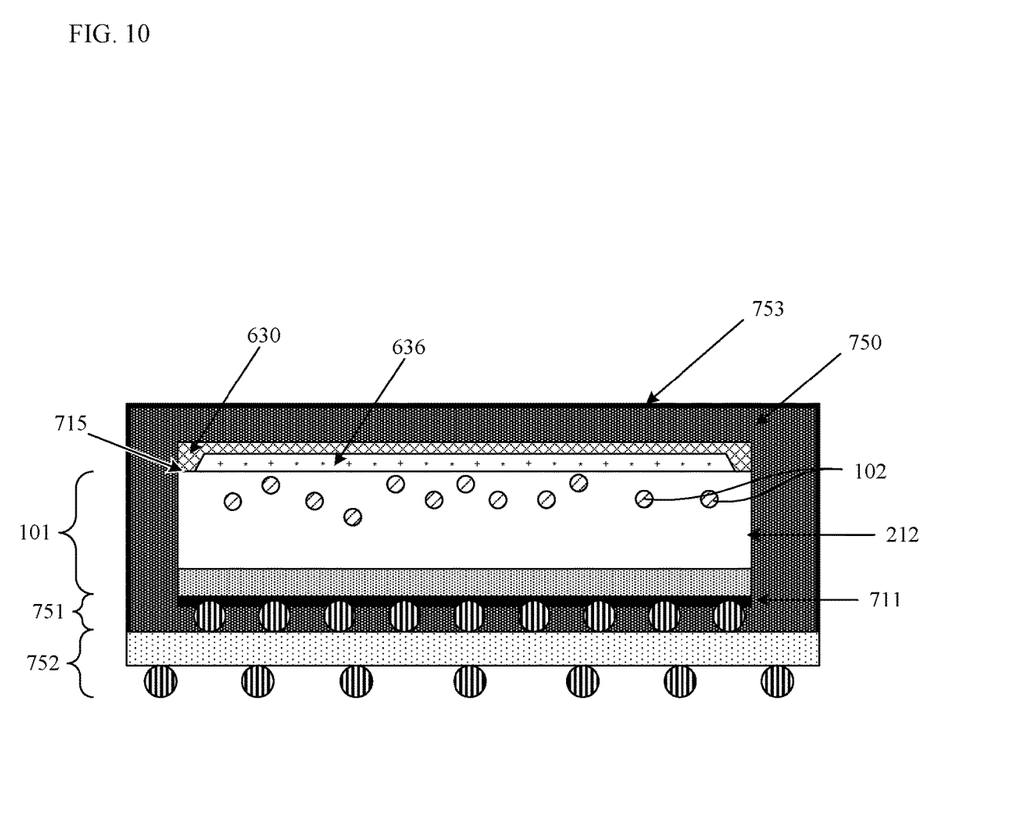
FIG. 10 is a cross-sectional view of a semiconductor device including an encapsulation mold compound providing external gettering according to a seventh embodiment described herein.

FIG. 10 is a cross-sectional view of a semiconductor device including external gettering according to a fifth embodiment. FIG. 10 illustrates a bulk substrate 101 including a device section 711, an internal gettering section 212, and a backside section 715. As shown in FIG. 10, semiconductor devices formed in device section 711 are connected to external electronic connections 752 (which may be, for example, a ball grid array package that is well known in the art) via solder bumps 751.

As shown in FIG. 10, bulk substrate 101 includes contaminants 102. It should be understood that, while an internal gettering section 212 is shown, embodiments need not include any internal gettering within substrate 101. In one embodiment, bulk substrate 101 in FIG. 10 may have already been subjected to a thinning process, such as a backside grinding process, and stress relief processes, such as DP, MCP, or CMP processes described above, in order to achieve a desired thickness and to maintain the die strength of substrate 101. In such an embodiment, backside section 715 is a stress relieved backside, as described above with regard to FIG. 4. Alternatively, substrate 101 may have been subjected to other thinning and/or polishing methods, or may not have been subjected to any thinning and/or polishing methods.

Substrate 101 is surrounded by encapsulation mold compound 750. According to known processes in the art, an encapsulation mold compound 750 may be applied through an aperture in an encapsulation mold 753 into a cavity formed by the encapsulation mold 753. The encapsulation mold 753 is subsequently removed, leaving the encapsulation mold compound 750 surrounding substrate 101. The encapsulation mold compound may be composed of various plastics and/or resins, such as a molded epoxy compound.

As described herein, in addition to providing physical, thermal, and/or electrical protection to semiconductor devices formed on substrate 101, at least a portion of encapsulation mold compound 750 may also be embedded with an additive in order to provide gettering to substrate 101. For example, encapsulation mold compound 750 may be embedded with organic and/or inorganic ions, such as those described above with regard to imbuing gettering material in FIGS. 5-9. The polarity and quantity of ions for the encapsulation mold compound may be highly situational and/or device dependent, and accordingly it should be understood that any appropriately embedded encapsulation mold compound may be used. As shown in FIG. 10, encapsulation mold compound 750 provides gettering to substrate 101, drawing contaminants 102 towards backside 715 and away from device section 711.

Figure 11:
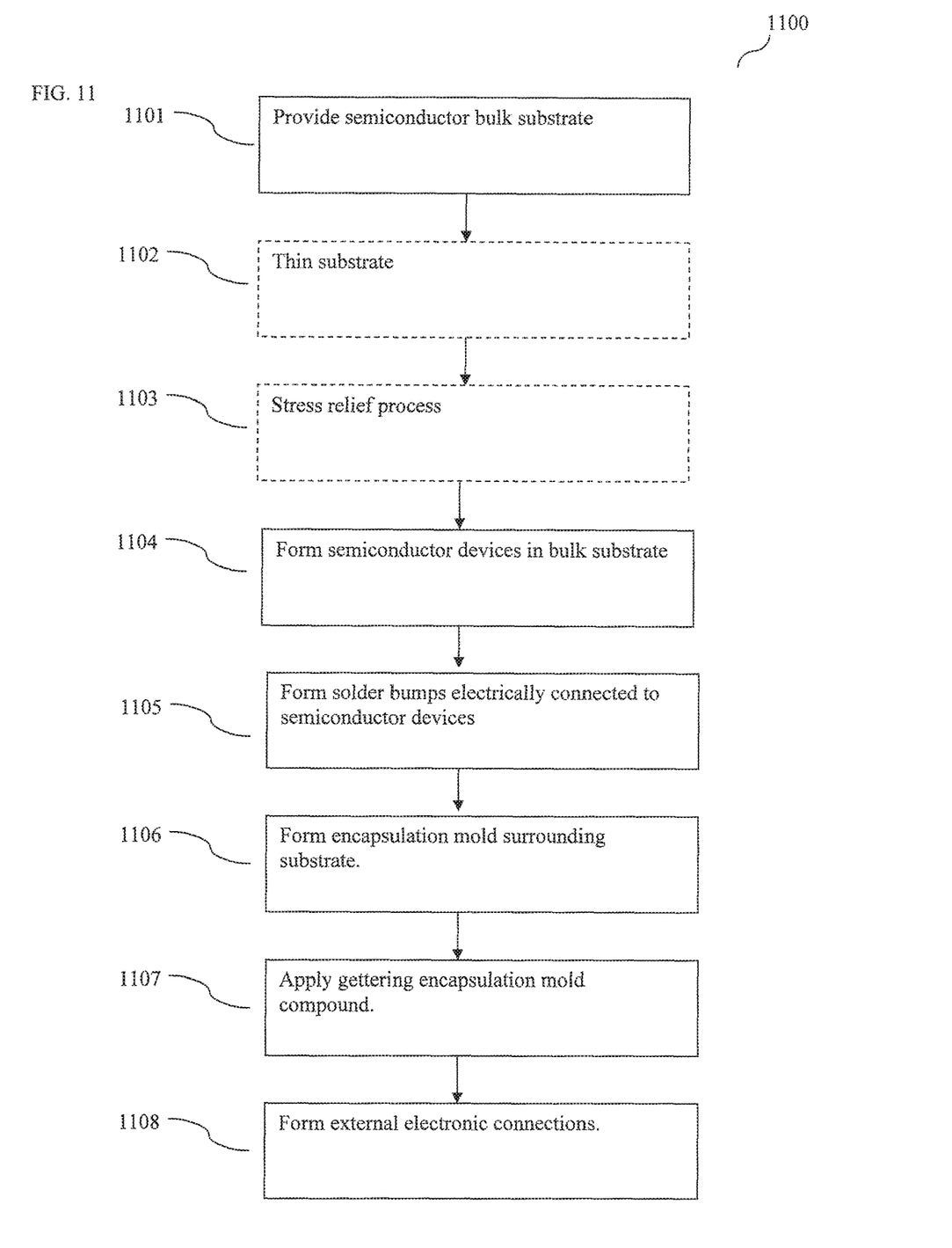
FIG. 11 is a flowchart illustrating steps of a fabrication process for a semiconductor device including an encapsulation mold compound providing external gettering.

FIG. 11 is a flowchart illustrating steps of a fabrication process 1100 for a semiconductor device including an encapsulation mold compound providing gettering. Process 1100 may be used to fabricate, for example, the embodiment described above with regard to FIG. 10.

In step 1101, a bulk semiconductor substrate is provided. The bulk semiconductor substrate may be, for example, a silicon substrate or other material, and may include an internal gettering section, as discussed above with regard to bulk substrate 101 (FIG. 5).

Optionally, in steps 1102 and 1103, the bulk substrate is thinned and polished, respectively. The thinning and/or polishing processes used in steps 1102 and 1103 may be those described above with regard to steps 902 and 903 of process 900 (FIG. 9). Alternatively, process 1100 may omit one or both of these steps.

In step 1104, semiconductor devices are formed in at least one section of the bulk substrate. Formed semiconductor devices may include, for example, source and drain structures, gate structures, channel sections, and other structures known in the art. In step 1105, solder bumps or other conductive connections are formed in order to provide electrical connections between devices formed on the substrate and external electronic connections 752 (see Step 1107, infra).

In step 1106, an encapsulation mold is provided surrounding the substrate. The encapsulation mold may include multiple pieces which form a cavity surrounding the substrate, and preferably includes at least one aperture for injecting encapsulation mold compound into the aperture.

In step 1107, gettering encapsulation mold compound is applied, for example by injection into the cavity formed by the encapsulation mold compound. Gettering encapsulation mold compound may be composed of conventional encapsulation mold compound materials, such as a plastic, resin, or other epoxy mold compound, which are embedded with organic and/or inorganic additives, in order to provide gettering to substrate 101. In one embodiment, only a portion of the encapsulation mold compound includes the organic and/or inorganic additives to provide gettering at a location of the substrate (e.g., backside 715 in FIG. 10). In another embodiment, substantially the entire encapsulation mold compound is embedded with the organic and/or inorganic additives. The gettering encapsulation mold compound attracts contaminants and forms a denude zone on the at least one section of the bulk substrate where the semiconductor devices are formed (see step 1104, supra).

After the gettering encapsulation mold compound is applied, the encapsulation mold may be removed. The encapsulation mold may be removed before or after completing fabrication of the semiconductor assembly, including step 1108 of process 1100 (infra).

In step 1108, external electronic connections may optionally formed to provide external connections for the semiconductor devices and solder bumps. For example, the external electronic connections may be a ball grid array package as shown in FIG. 10, or other external electronic connections known in the art that may be used to form integrated circuits or other semiconductor device assemblies. The external electronic connections may be formed near the device region, for example connecting via solder bumps to the semiconductor devices in the device region, as shown in FIG. 10.

It should be understood that while FIGS. 10 and 11 show the formation of a semiconductor device without an external gettering element as described above with regard to FIGS. 5 through 9, this need not be the case. For example, a semiconductor device including an external gettering element adhered to a backside of the substrate may be encapsulated by a gettering encapsulation mold compound.

The above description and drawings are only to be considered illustrative of specific embodiments, which achieve the features and advantages described herein. Modification and substitutions to specific processes, process conditions, and structures can be made. For example, it should be understood that appropriate materials other than those specifically described in connection with the above embodiments may be used, and that the steps of the processes described above may be performed in a different order than the specific order in which they are described. Accordingly, the embodiments of the invention are not to be considered as being limited by the foregoing description and drawings, but only by the scope of the appended claims.

We claim:

1. An integrated circuit comprising:

a semiconductor substrate;

at least one semiconductor device formed on a first section of said semiconductor substrate; and electronic packaging external to said semiconductor substrate, wherein at least a portion of said electronic packaging adjacent to a second section of said semiconductor substrate comprises a gettering material and an adhesive material applied at a backside of said semiconductor substrate, wherein said gettering material is configured to attract contaminants within said semiconductor substrate away from said first section, wherein said gettering material is separate from said adhesive material, wherein said electronic packaging comprises an encapsulation mold compound surrounding at least a portion of said semiconductor substrate, and wherein at least a portion of said encapsulation mold compound is embedded with additives in order to attract ions or contaminants within said semiconductor substrate toward said second section.

2. The integrated circuit of claim 1, wherein said gettering material is imbued with particular polarities or quantities of ions in order to attract the ions or contaminants within said semiconductor substrate toward said second section.

3. The integrated circuit of claim 1, wherein all of said encapsulation mold compound is embedded with said additives.

4. The integrated circuit of claim 1, wherein said electronic packaging comprises a plurality of solder bumps formed on said at least one semiconductor device.

5. The integrated circuit of claim 1, wherein said gettering material is arranged adjacent a majority of said second section of said semiconductor substrate.

6. The integrated circuit of claim 1, further comprising an internal gettering section between said first section and said gettering material.

7. The integrated circuit of claim 1, wherein said adhesive material is configured to adhere said gettering material to said section of said semiconductor substrate.

* * * * *